(12) United States Patent
Addis

(10) Patent No.: US 6,246,029 B1
(45) Date of Patent: Jun. 12, 2001

(54) HIGH TEMPERATURE SEMICONDUCTOR CRYSTAL GROWING FURNACE COMPONENT CLEANING METHOD

(75) Inventor: Kennard K. Addis, Washougal, WA (US)

(73) Assignee: SEH America, Inc., Vancouver, WA (US)

(*) Notice: Subject to any disclaimer, the term of this patent is extended or adjusted under 35 U.S.C. 154(b) by 0 days.

(21) Appl. No.: 09/253,815

(22) Filed: Feb. 19, 1999

(51) Int. Cl.[7] .............................. F27D 11/02; F27D 15/00; B08B 5/00
(52) U.S. Cl. .............................. 219/390; 393/411; 134/1; 134/37; 438/905
(58) Field of Search ...................................... 219/390, 391, 219/393, 411; 118/724, 725, 50.1; 117/13, 20; 134/1, 1.1, 2, 37; 438/905; 392/418

(56) References Cited

U.S. PATENT DOCUMENTS

| | | | |
|---|---|---|---|
| 4,265,859 | * 5/1981 | Jewett | 422/199 |
| 4,316,430 | * 2/1982 | Jolly et al. | 118/725 |
| 5,069,724 | * 12/1991 | Kobayashi et al. | 134/37 |
| 5,074,017 | * 12/1991 | Toya et al. | 29/25.01 |
| 5,254,176 | * 10/1993 | Ibuka et al. | 134/2 |
| 5,259,888 | * 11/1993 | McCoy | 134/2 |
| 5,275,976 | * 1/1994 | Moslehi | 438/905 |
| 5,380,370 | * 1/1995 | Niino et al. | 134/2 |
| 5,868,852 | * 2/1999 | Johnson et al. | 134/1.1 |

OTHER PUBLICATIONS

"Investigation of High Power Gaseous Electronics," Report No. 6, Sixth Quarterly Progress Report, Feb. 16, 1964 to May 15, 1964, U.S. Army Electronics Laboratories, Fort Monmouth, New Jersey, Microwav Associate Inc., Burlington, Massachusetts.

"Removal of Thermally Grown Silicon Dioxide Films Using Water at Elevated Temperature and Pressure," *J. Electrochem Soc.*, vol. 142, No. 11, Nov. 1995, The Electrochemical Society, Inc.

* cited by examiner

Primary Examiner—Joseph Pelham
(74) Attorney, Agent, or Firm—Kolisch, Hartwell, Dickinson, McCormack & Heuser

(57) ABSTRACT

A method is provided for cleaning deposits from a component of a semiconductor crystal growing furnace, where the furnace includes a hot zone and where the component is positioned outside the hot zone during the crystal growing process. The method typically includes providing the furnace including the component, removing the component from outside the hot zone, placing the component within the hot zone, and heating the hot zone to clean the component. The component may be virtually any furnace component, including a graphite chimney, purge tube, quartz window, or ceramic insulator.

28 Claims, 5 Drawing Sheets

HIGH TEMPERATURE SEMICONDUCTOR CRYSTAL GROWING FURNACE COMPONENT CLEANING METHOD

TECHNICAL FIELD

The present invention relates generally to cleaning semiconductor manufacturing equipment, and, more particularly, to cleaning unwanted deposits from components of semiconductor crystal growing furnaces.

BACKGROUND OF THE INVENTION

In the semiconductor industry, crystal growing furnaces are used to produce ingots of semiconductor material. According to the most common crystal growing technique, the Czochralski Method, purified polycrystalliie silicon is heated to a molten liquid inside a crystal growing furnace. A small, monocrystalline silicon seed is introduced to the silicon melt, and is rotated slowly and pulled from the melt. As the seed is slowly withdrawn, molten silicon solidifies on the seed, thereby increasing its size. By varying the rotation and pull rates, a resultant monocrystalline silicon ingot of a desired shape and size may be produced. Typically, silicon ingots are produced in industry-standard 200 mm or 300 mm diameter cylinders.

Crystal growing furnaces typically include a pair of concentric quartz and graphite crucibles into which raw polycrystalline silicon material is placed for melting. Surrounding the crucibles is a generally cylindrical-shaped graphite heating element. Surrounding the heating element, in turn, are one or more graphite heat shields and a water-cooled jacket, typically of stainless steel material.

The region within and immediately outside the heating element is termed the "hot zone" because during the crystal growing process the temperatures therein are above the melting point of the silicon melt, which is approximately 1410° C. for pure silicon. The regions of the furnace outside of the hot zone, including the neck region into which the solidified silicon ingot is pulled, typically are maintained at lower temperatures than the hot zone. Therefore, the silicon is able to solidify as it is withdrawn from the melt into a region of lower temperature.

To decrease contamination due to reaction of the silicon with oxygen and other atmospheric gases, the crystal growing process takes places in an inert gas environment. The crystal growing furnace typically includes a graphite purge tube, extending from the neck region to just above the silicon melt to guide the inert gas to the melt, and a graphite chimney, surrounding the purge tube, to decrease turbulence in the flow of the inert gas through the crystal growing furnace.

One common problem experienced by users of crystal growing furnaces is the build-up of deposits such as oxides on certain components in the crystal growing furnace that are located outside the hot zone during the crystal growing process. For example the graphite chimneys and purge tubes commonly experience build-up of deposits along their inner surfaces. Deposits also accumulate on quartz windows located in the purge tube. In addition, ceramic insulators configured to insulate electrodes that supply current to the heating element also commonly experience build-up of deposits on their surfaces.

These deposits are thought to be silicon dioxide, and also may contain trace quantities of boron, antimony, and/or phosphorous, among other materials, and may be of various other material compositions. These deposits, if left uncleaned, may fall into the silicon melt during crystal growth, thereby contaminating the silicon. In addition, because the deposits may cool at a different rate from the materials upon which they have accumulated, they may flake off during heating or cooling of the furnace. If they do not flake off, the deposits may induce thermal stresses that cause certain components, such as the chimneys, to explode or crack during heating and cooling. Build-up on the ceramic insulators may cause arcing to occur from the electrode to nearby metal parts, especially in crystal growing furnaces used with silicon containing high concentrations of conductive dopants, such as antimony.

Several methods of cleaning the deposits from the components currently are known. Vacuums may remove certain dust-like particles; however, they fail to remove hard, caked-on build-up. Machines with abrasive grinders including embedded diamond material are capable of removing the build-up from the graphite purge tubes and chimneys; however, the grinding causes severe damage to the surface of the graphite. Abrasive methods also cause damage to the underlying surfaces of quartz and ceramic components. Blasting methods, such as glass bead and frozen carbon dioxide pellet blasting, are less capable of removing the hard, caked-on deposits, and cause severe pitting of component surfaces.

Because known cleaning methods damage the underlying surface of the furnace components, the components experience a decreased life span, thereby increasing the cost of manufacturing the silicon ingots. Damage resulting from the most efficient of the known cleaning methods, abrasive grinding, has resulted in actual lifetimes for the furnace components of less than one-sixth of their expected lifetimes. It will be appreciated that the aggregate cost of damage resulting from the build-up of deposits on components outside the hot zone of crystal growing furnaces is great.

SUMMARY OF THE INVENTION

A method is provided for cleaning deposits from a component of a semiconductor crystal growing furnace, where the furnace includes a hot zone and where the component is positioned outside the hot zone during the crystal growing process. The method typically includes providing the furnace including the component, removing the component from outside the hot zone, placing the component within the hot zone, and heating the hot zone to clean the component. The component may be virtually any furnace component, including a graphite chimney, purge tube, quartz window, or ceramic insulator. The method may include positioning the component inward of a heating element of the furnace. Where the component is a chimney, the method may also include providing an inner heat shield mounted in the furnace in a predetermined location extending around the hot zone outward of the heating element, removing the inner heat shield from the predetermined location in the furnace, and positioning the chimney outward of the heating element in the predetermined location.

The advantages of the present invention will be understood more readily after a consideration of the drawings and the following description of the invention.

DETAILED DESCRIPTION AND BEST MODE FOR CARRYING OUT THE INVENTION

Figure 1:
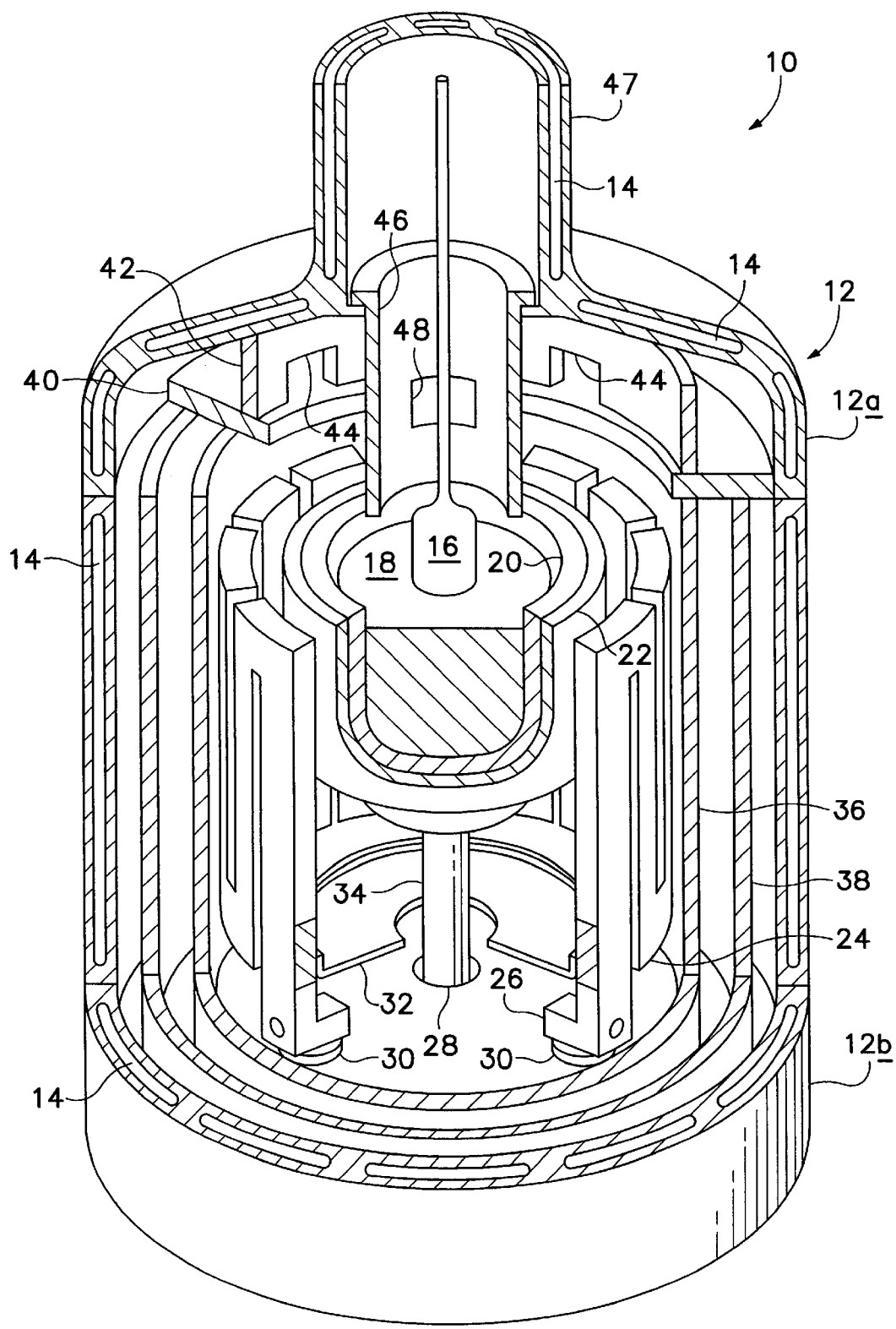
FIG. 1 is a cutaway perspective view of a crystal growing furnace.

Referring initially to FIG. 1, a prior art crystal growing furnace is shown generally at 10. Crystal growing furnace 10 is similar to several crystal growing furnaces used in the semiconductor manufacturing industry, including the Kayex Model CG6000, available from Kayex Corporation of Rochester, N.Y.

Crystal growing furnace 10 includes a water-cooled jacket 12 including a jacket cover 12a configured to seal to a jacket base 12b. Jacket 12 may include chambers 14 for containing and circulating water to cool the jacket. Alternatively, jacket 12 may include piping for circulating water attached to the outer and/or inner surfaces of the jacket.

Typically, crystal growing furnace 10 is operated under vacuum conditions, and jacket 12 is airtight. Crystal growing furnace 10 is configured to flow an inert gas, such as argon, through the furnace when the vacuum is established.

Within crystal growing furnace 10, an ingot of monocrystalline silicon 16 is pulled from a bath of molten silicon 18, also referred to as melt 18. The molten silicon is contained by a quartz crucible 20, which in turn rests within a graphite crucible 22. Molten silicon 18 is kept at a temperature slightly above the melting point of the silicon melt, approximately 1410° C. for pure silicon, by heating element 24. Heating element 24 typically is of graphite construction. An electrode (not shown) extends through heater foot 26 and base 28 and provides power input to heating element 24. Ceramic insulator 30 insulates the electrode from base 28.

Spill tray 32 is positioned at the base of heating element 24 to catch any molten silicon that may spill from quartz crucible 20 and/or graphite crucible 22. Crucible lift assembly 34 supports and lifts quartz and graphite crucibles 20 and 22 into position within the heating element.

An inner heat shield 36 is disposed concentrically around heating element 24 to insulate and reflect heat into a hot zone, which extends inward of the inner heat shield approximately from the top of heating element 24 to the bottom of heating element 24. Outer heat shield 38 extends concentrically around inner heat shield 36 and further insulates and directs heat back into the hot zone. The heating element and inner and outer heat shields act together to heat the hot zone to a temperature above the melting temperature of the molten silicon 18. Alternatively, the furnace may include only a single heat shield, such as when the furnace is equipped with only an outer heat shield, or when the inner heat shield is removed temporarily from the furnace, in which case the hot zone extends inward of the single shield.

A ring 40 rests upon the top of the inner and outer heat shields 36 and 38, and extends inward and around the inner perimeter of jacket 12. Chimney 42, typically of graphite construction, is supported above the hot zone by ring 40 and functions to decrease turbulence in the flow of the inert gas within the crystal growing furnace. Chimney 42 includes vents 44 for directing the flow of the inert gas. Purge tube 46, also typically graphite, extends downward from a neck portion 47 of the crystal growing furnace to a region just above silicon melt 18. Purge tube 46 directs the flow of the inert gas from the neck portion of the furnace to the surface of melt 18. Purge tube 46 typically is positioned completely outside of the hot zone at the commencement of the crystal growing process, and is partially lowered into the hot zone as the level of the silicon melt in the quartz crucible lowers. Purge tube 46 includes a quartz window 48 through which the silicon ingot may be viewed. To look through window 48 during operation of the furnace, a viewing portal (not shown) typically is provided in jacket 12.

In operation, crystal growing furnace 10 provides heat to polycrystalline silicon contained in quartz crucible 20 by means of heating element 24, until the silicon reaches a molten state and forms melt 18. A monocrystalline silicon seed crystal then is lowered into the melt. The silicon in the quartz crucible is kept at a temperature slightly above its melting point. However, silicon in contact with the seed crystal is slightly cooler, and is thus able to solidify, due to conduction of heat through the seed crystal away from the melt. The silicon solidifies on the seed crystal and causes the seed crystal to grow. By a combination of rotating the seed crystal relative to melt 18 and drawing the seed crystal out of the melt, a generally cylindrical ingot of monocrystalline silicon of the desired size may be formed.

To decrease oxidization and particulate contamination during the silicon crystal growing process, the furnace is evacuated and flowed with an inert gas, typically argon. During normal operation of the furnace, heat from the crystal growing process prevents build-up of deposits within the hot zone. However, deposits build up on portions of certain components located within the furnace but outside of the hot zone during the crystal growing process. For example, silicon dioxide and other deposits may build up on chimney 44, purge tube 46, quartz window 48, and ceramic insulators 30, all components outside of the hot zone. Deposits on chimney 44, purge tube 46, and quartz window 48 may flake off and contaminate the melt during the crystal growing process. In addition, deposits on ceramic insulator 30 may cause arcing to occur between the electrode and the stainless steel base, especially when levels of conductive dopants in the silicon melt are high. As previously discussed, current methods for removal of these deposits have proved damaging to the underlying components, resulting in frequent and costly replacement of the components.

Figure 2:
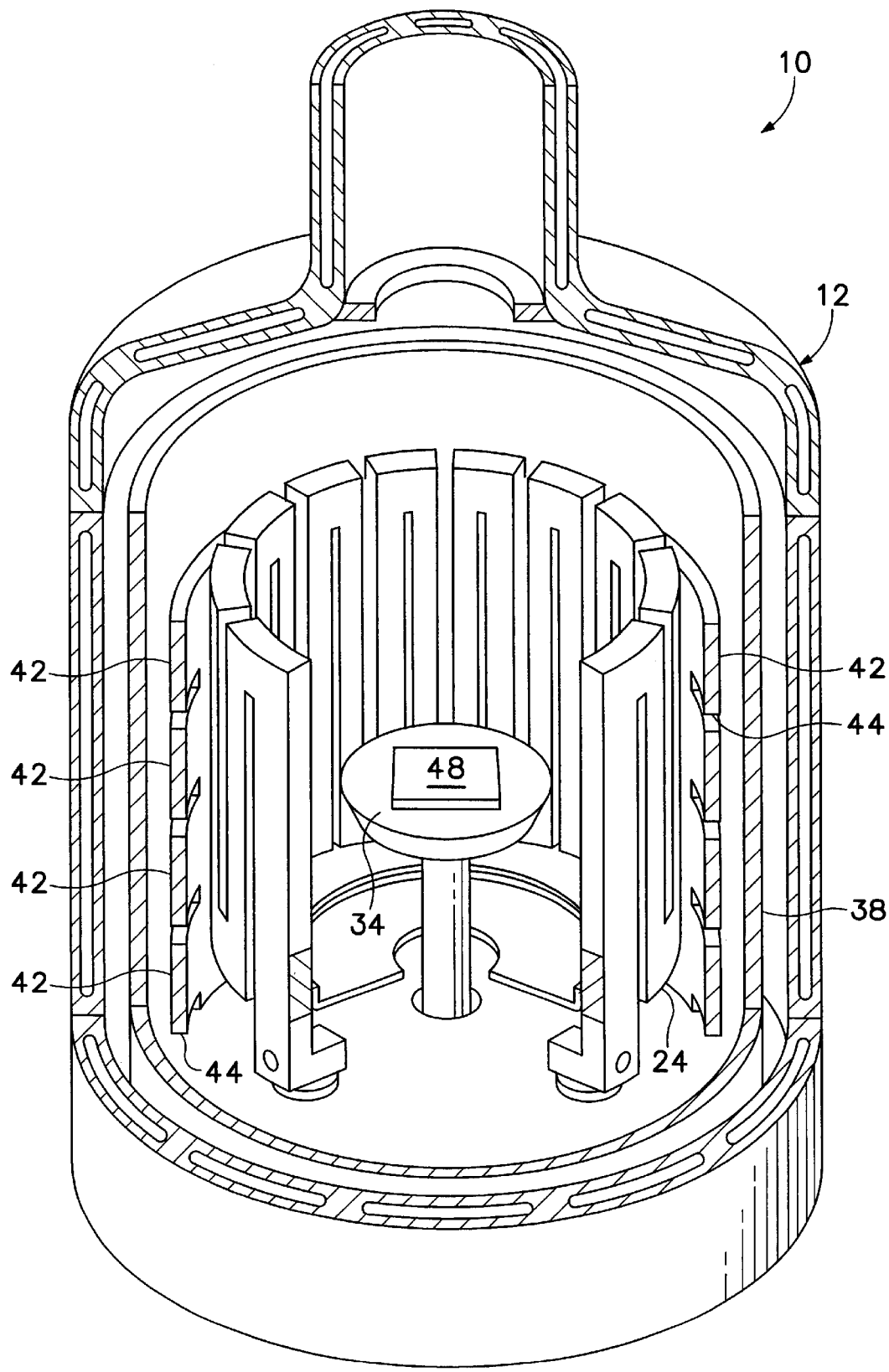
FIG. 2 is a cutaway perspective view of a crystal growing furnace configured to clean a chimney positioned outward of the heating element.

Referring now to FIGS. 1 and 2, a method according to the present invention for cleaning a component of a crystal growing furnace is described. The method may be used to clean virtually any component of the crystal growing furnace that is positioned outside the hot zone during normal crystal growing operations, and on which deposits accumulate during the crystal growing process.

The method also includes removing a component of a crystal growing furnace, such as chimney 42, purge tube 46, quartz window 48, or ceramic insulator 30, from a respective installed position outside the hot zone of the furnace. Typically, the component is completely outside the hot zone in the installed position. Alternatively, only a portion of the component is continuously outside of the hot zone in the installed position, such as when a purge tube is partially lowered into the hot zone during crystal growth. In this case, an upper portion of the purge tube remains outside of the hot zone during crystal growth, and a lower portion of the purge tube is slowly lowered into the hot zone as the level of the silicon melt in the quartz crucible lowers. Unwanted deposits tend to accumulate on the cooler, upper portion of the purge tube.

Typically, the component is removed from the same crystal growing furnace in which the component is to be cleaned. Alternatively, where removal of a component renders a crystal growing furnace unable to bake, such as does the removal of a ceramic insulator, or where otherwise desirable, the component may be removed from one crystal growing furnace and cleaned in a separate crystal growing furnace.

The component may be removed by accessing the interior region of the crystal growing furnace. This may be done by separating jacket cover 12a from jacket base 12b with a hydraulic lift or other mechanism, and by then rotating or otherwise moving the jacket cover away from the jacket base. Typically, quartz crucible 20 and graphite crucible 22 also are removed from the furnace before cleaning the component, as shown in FIG. 2.

After removal of the component, the method includes placing the component in the interior region of the furnace within the hot zone of the furnace. As described above, the hot zone of a furnace is an area in which the heating element sustains the temperature above the melting point of melt 18. The hot zone typically extends in height from the bottom of the heating element to the top of the heating element, and includes the area inward of the innermost heat shield. Typically, the entire component is placed within the hot zone to remove the deposits. Alternatively, he portion of the component that remained outside of the hot zone during crystal growth is placed within the hot zone.

When the invention is practiced on the Kayex Model CG6000 furnace to clean a chimney, the method typically includes removing chimney 42 and ring 40. The method may also include removing interior heat shield 36 from its location surrounding the heating element, and positioning chimney 42 in the location the inner heat shield formerly occupied, as shown in FIG. 2. In this orientation, the chimney surrounds the heating element, and an inside surface of the chimney faces an outside surface of the heating element. Typically, multiple chimneys are stacked one atop the other within the furnace, so that three or four chimneys may be cleaned at a time. Depending on the geometry of the furnace, one or more of the stacked chimneys may be placed below the hot zone as a support, at which location the support chimney may not receive enough heat to remove the deposits. Where the chimney is smaller than the heating element, the method also may be practiced by placing the chimney inward of the heating element such that the heating element surrounds the chimney and an outer surface of the chimney faces an inner surface of the heating element, as shown in FIG. 3.

Figure 3:
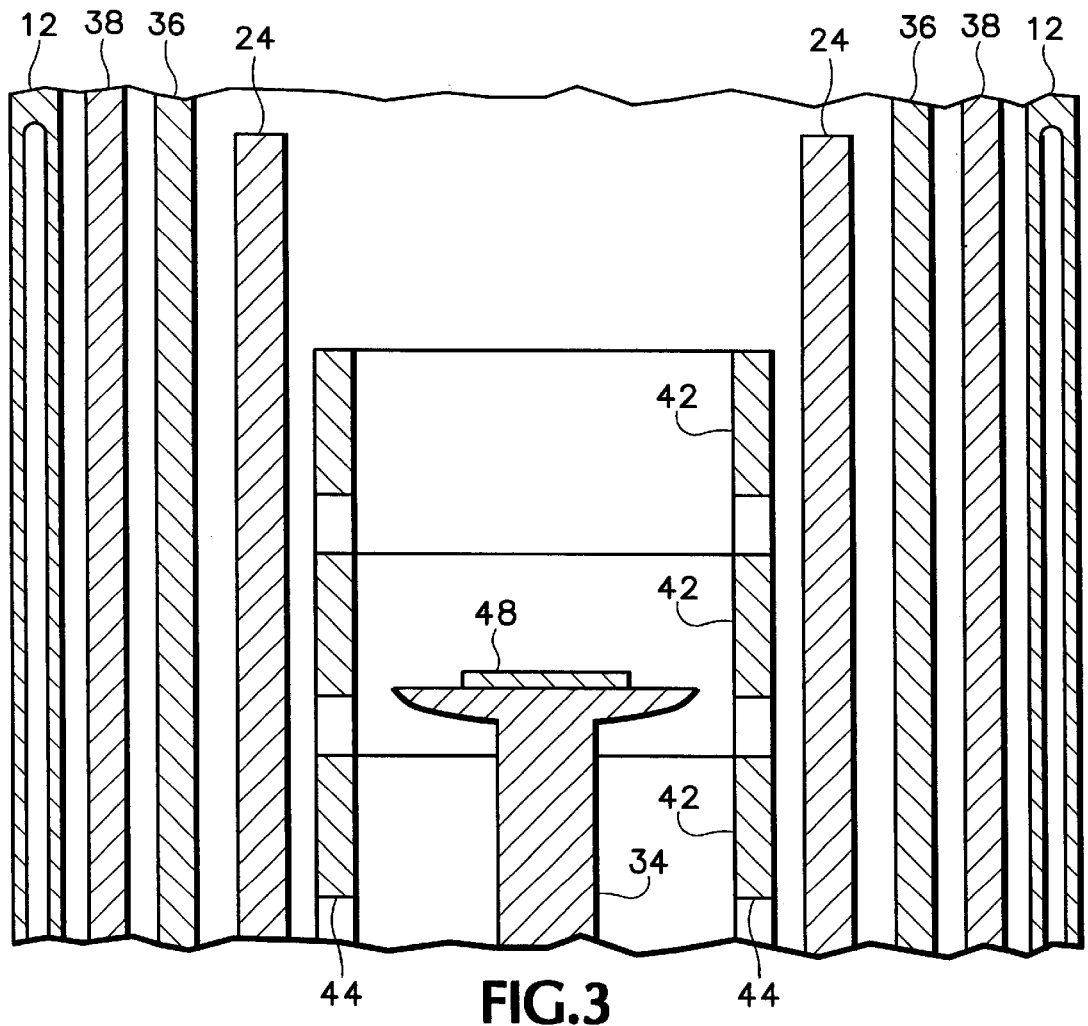
FIG. 3 is a cutaway side view of a section of a crystal growing furnace configured to clean a chimney positioned inward of the heating element.
Figure 4:
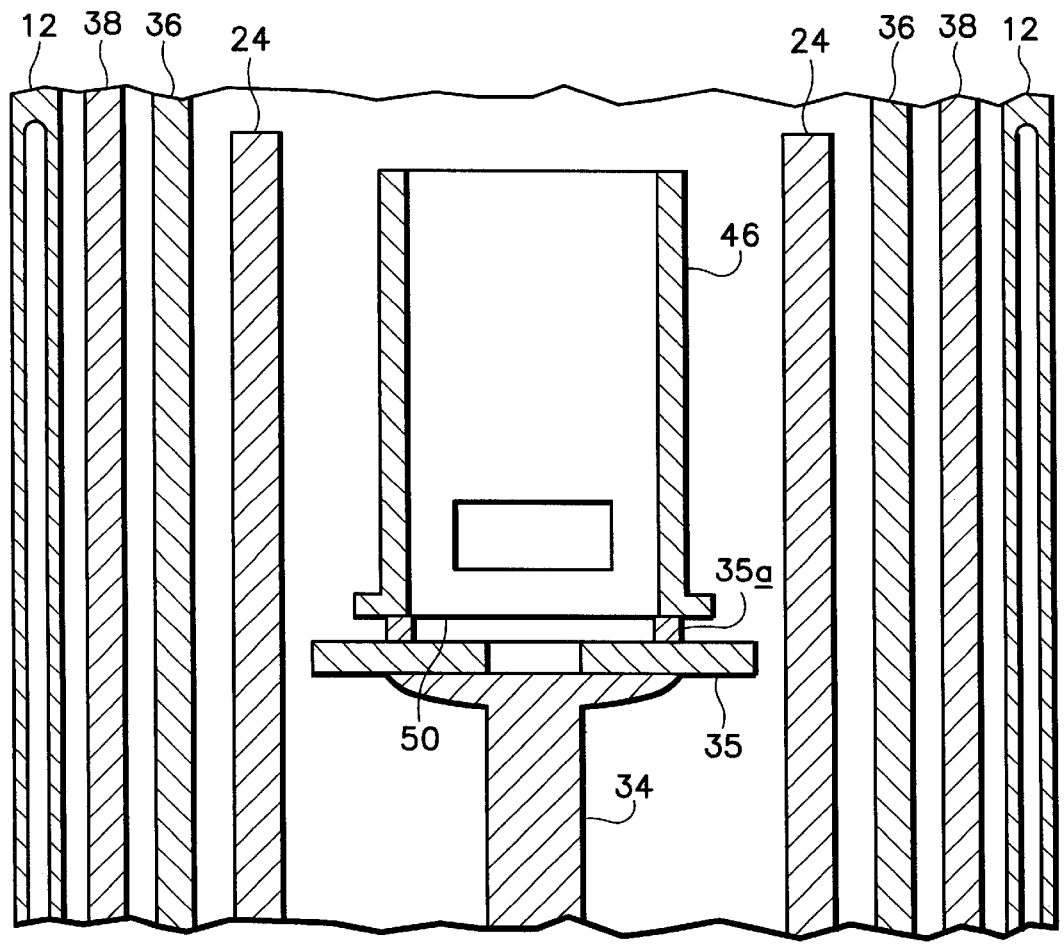
FIG. 4 is a cutaway side view of a section of a crystal growing furnace configured to clean a purge tube.
Figure 5:
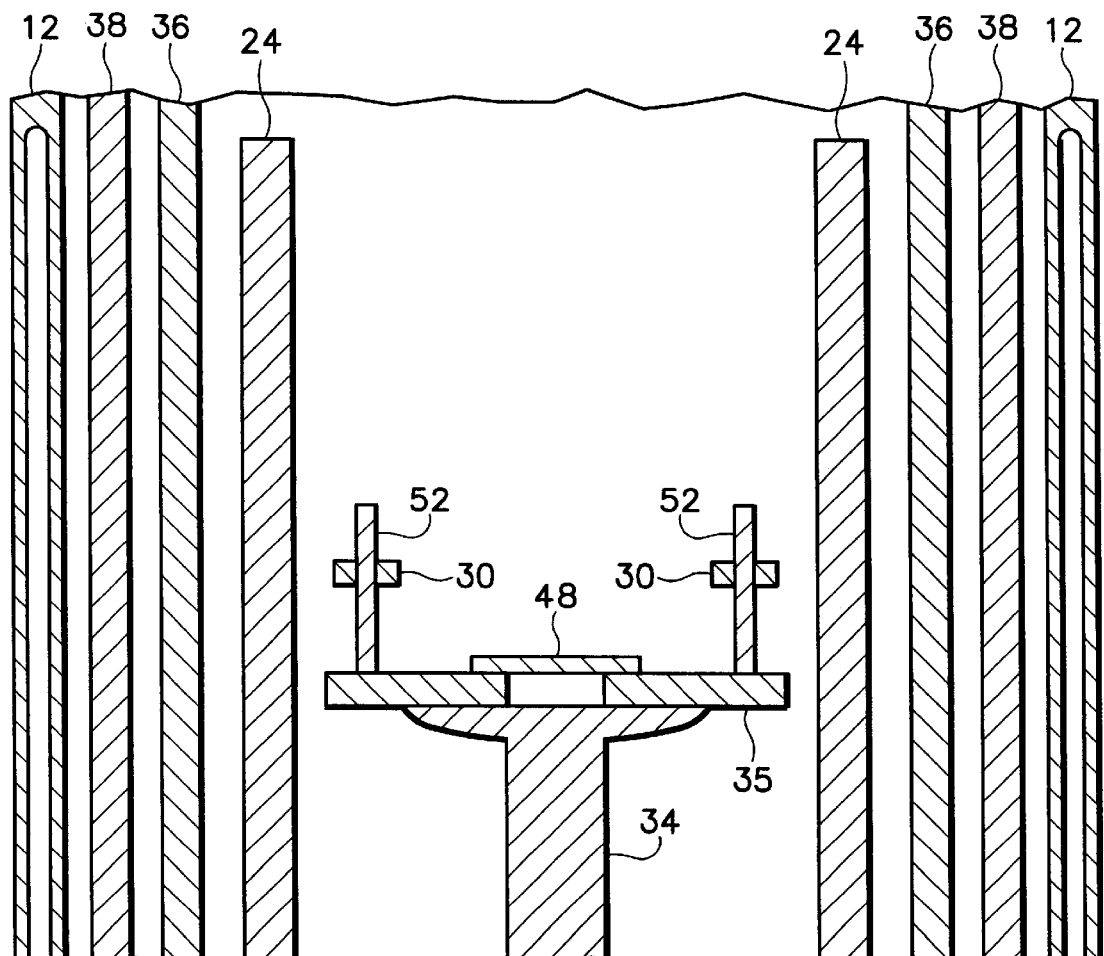
FIG. 5 is a cutaway side view of a section of a crystal growing furnace configured to clean a quartz window and ceramic insulators.

As shown in FIGS. 2–5, when the method is employed to clean a purge tube, ceramic insulator, quartz window, or other component that may be positioned in a region interior of the cylindrical heating element, the method may further include supporting the component on crucible lift 34. Components may be placed directly on crucible lift 34, as shown in FIGS. 2 and 3, or on a support member 35 supported by the crucible lift, as shown in FIGS. 4 and 5. As shown in FIG. 4, where a purge tube is placed on the support member, the support member typically includes raised surfaces, such as a pair of longitudinal spacers 35a, to raise the purge tube off of the support member and create vents 50 between a bottom of the purge tube and a top surface of the support member. Vents 50 enable deposits removed during cleaning to flow out of the purge tube. Alternatively, the support member contains no raised surfaces. The purge tube may be placed such that the entire purge tube is located within the hot zone, or such that only that portion of the purge tube that remains outside of the hot zone during the crystal growing process is placed within the hot zone.

As shown in FIG. 5, ceramic insulator 30 may be supported by a vertical mount 52 on the support member. Quartz window 48 may be positioned on the support member, or directly on the crucible lift, as shown in FIG. 3.

Once the component is placed within the hot zone, the method typically includes replacing jacket cover 12a on jacket base 12b and sealing jacket 12. After the jacket is sealed, the method typically includes evacuating atmosphere from the interior region of the furnace, and establishing a vacuum in the furnace. Pressure in the vacuum may range from 5 millibar to atmospheric pressure, and is typically 52–90 millibar on the Kayex Model CG6000.

In addition, the method also may include flowing an inert gas, such as argon, through the crystal growing furnace when the vacuum is established. The flow rate of the inert gas may range from 10 to 500 liters per minute, and typically is 55 liters per minute on the Kayex Model CG6000.

The method further includes heating the hot zone to clean the component. The hot zone is heated by supplying power to the heating element of the crystal growing furnace. Power supplied to the heating element may range from 75 to 150 kilowatts and typically is 100 kilowatts for the Kayex Model CG6000. The crystal growing furnace typically is heated for a period of two hours. Alternatively, a longer period may be used, such as a period of four hours.

After heating the furnace, the method typically further includes cooling the furnace to substantially near room temperature, evacuating the furnace of the inert gas, and returning the furnace to atmospheric pressure. After the furnace is at atmospheric pressure, the furnace is opened to enable access to the component and residual dust left on the component by the cleaning process may be vacuumed away. The component then may be removed from the crystal growing furnace.

Utilization of the present method to clean certain components of a crystal growing furnace has resulted in increased component life and decreased replacement costs. In addition, it has rendered prior methods of cleaning the components, including abrasive and blasting methods, obsolete, further decreasing labor and supply costs associated with cleaning the components.

INDUSTRIAL APPLICABILITY

This invention is applicable to the semiconductor processing industry, and particularly to semiconductor crystal growing furnaces used in manufacturing semiconductor ingots.

While the invention has been disclosed in its preferred form, the specific embodiments thereof as disclosed and illustrated herein are not to be considered in a limiting sense as numerous variations are possible. Applicant regards the subject matter of the invention to include all novel and non-obvious combinations and subcombinations of the various elements, features, functions and/or properties disclosed herein. No single feature, function, element or property of the disclosed embodiments is essential. The following claims define certain combinations and subcombinations which are regarded as novel and non-obvious. Other combinations and subcombinations of features, functions, elements and/or properties may be claimed through amendment of the present claims or presentation of new claims in this or a related application. Such claims are also regarded as included within the subject matter of applicant's invention irrespective of whether they are broader, narrower, or equal in scope to the original claims.

I claim:

1. A method of cleaning deposits from a component of a semiconductor crystal growing furnace, where the furnace is used in a crystal growing process, where the furnace includes a hot zone and a heating element configured to heat the hot zone, and where the component is outside the hot zone during the crystal growing process, the method comprising:

providing the furnace including the component;

removing the component from outside the hot zone;

placing the component within the hot zone; and heating the hot zone by the heating element to clean the component, without flowing a reactive gas through the furnace.

2. The method of claim 1, where the component is a chimney and placing the component within the hot zone includes positioning the chimney in a location proximate the heating element.

3. A method of cleaning deposits from a chimney of a semiconductor crystal growing furnace, where the furnace is used in a crystal growing process, where the furnace includes a hot zone, a heating element configured to heat the hot zone, and an outer heat shield extending around the hot zone outside of the heating element, and where the chimney is outside the hot zone during the crystal growing process, the method comprising:

providing the furnace including the chimney;

removing the chimney from outside the hot zone;

placing the chimney within the hot zone by positioning the chimney proximate the heating element, outward of the heating element and inward of the outer heat shield; and heating the hot zone by the heating element to clean the chimney.

4. The method of claim 3, where the furnace includes an inner heat shield mounted in the furnace in a predetermined location extending around the hot zone outward of the heating element and inward of the outer heat shield, the method further comprising:

before heating the hot zone, removing the inner heat shield from the predetermined location in the furnace; and positioning the chimney outward of the heating element and inward of the outer heat shield in the predetermined location.

5. The method of claim 2, where placing the component within the hot zone includes positioning the chimney inward of the heating element.

6. The method of claim 2, where the chimney includes a vent and placing the component inside the hot zone includes positioning the chimney proximate the heating element with the vent of the chimney oriented downward, thereby allowing the deposits to flow through the vent after heating the hot zone.

7. The method of claim 2, further comprising:

before heating the hot zone, stacking multiple chimneys atop each other within the hot zone.

8. The method of claim 1, where the component is a purge tube and placing the component inside the hot zone includes positioning the purge tube inward of the heating element.

9. A method of cleaning deposits from a purge tube of a semiconductor crystal growing furnace, where the furnace is used in a crystal growing process, where the furnace includes a hot zone and a heating element configured to heat the hot zone, and where an upper portion of the purge tube is positioned outside the hot zone during the crystal growing process, and a lower portion of the purge tube is positioned inside the hot zone during the crystal growing process, the method comprising:

providing the furnace including the purge tube;

removing the purge tube from outside the hot zone;

placing the purge tube within the hot zone by positioning the upper portion of the purge tube inward of the heating element; and heating the hot zone by the heating element to clean the purge tube.

10. The method of claim 8, where the furnace includes a crucible configured to contain molten silicon, and a crucible lift configured to support the crucible within the hot zone, each of the crucible and the crucible lift being mounted in an interior region of the furnace, the method further comprising:

before heating the hot zone, removing the crucible from the furnace; and supporting the purge tube within the hot zone with the crucible lift.

11. A method of cleaning deposits from a purge tube of a semiconductor crystal growing furnace, where the furnace is used in a crystal growing process, where the furnace includes a hot zone and a heating element configured to heat the hot zone, where the furnace further includes a crucible configured to contain molten silicon, and a crucible lift configured to support the crucible within the hot zone, each of the crucible and the crucible lift being mounted in an interior region of the furnace, and where the purge tube is outside the hot zone during the crystal growing process, the method comprising:

providing the furnace including the purge tube;

removing the purge tube from outside the hot zone;

placing the purge tube within the hot zone by positioning the purge tube inward of the heating element;

removing the crucible from the furnace;

placing a support member on the crucible lift;

supporting the purge tube within the hot zone with the crucible lift by positioning the purge tube on the support member; and heating the hot zone by the heating element to clean the purge tube.

12. The method of claim 11, where the support member includes raised surfaces and the purge tube rests on the raised surfaces to form vents at the base of the purge tube, the vents being configured to facilitate flow of deposits out of the purge tube after heating the hot zone.

13. A method of cleaning deposits from a component of a semiconductor crystal growing furnace, where the furnace is used in a crystal growing process, where the furnace includes a hot zone and a heating element configured to heat the hot zone, and where the component is outside the hot zone during the crystal growing process, the method comprising:

providing the furnace including the component;

removing the component from outside the hot zone;

placing the component within the hot zone; and heating the hot zone by the heating element to clean the component;

where the component is a ceramic insulator.

14. The method of claim 13, where the furnace includes a crucible configured to contain molten silicon, and a crucible lift configured to support the crucible within the hot zone, each of the crucible and the crucible lift being mounted in an interior region of the furnace, the method further comprising:

before heating the hot zone, removing the crucible from the furnace; and supporting the ceramic insulator in the hot zone with the crucible lift.

15. The method of claim 14, where supporting the ceramic insulator with the crucible lift further includes placing the ceramic insulator on a vertical mount supported by the crucible lift.

16. A method of cleaning deposits from a component of a semiconductor crystal growing furnace, where the furnace is used in a crystal growing process, where the furnace includes a hot zone and a heating element configured to heat the hot zone, and where the component is outside the hot zone during the crystal growing process, the method comprising:

providing the furnace including the component;

removing the component from outside the hot zone;

placing the component within the hot zone; and heating the hot zone by the heating element to clean the component;

where the component is a quartz window.

17. The method of claim 16, where the furnace further includes a crucible lift, and placing the component further includes supporting the quartz window with the crucible lift.

18. A method of cleaning deposits from a component of a semiconductor crystal growing furnace, where the furnace is used in a crystal growing process, where the furnace includes a hot zone and a heating element configured to heat the hot zone, and where the component is outside the hot zone during the crystal growing process, the method comprising:

providing the furnace including the component;

removing the component from outside the hot zone;

placing the component within the hot zone; and heating the hot zone by the heating element to clean the component;

where the component is ceramic.

19. A method of cleaning deposits from a component of a semiconductor crystal growing furnace, where the furnace is used in a crystal growing process, where the furnace includes a hot zone and a heating element configured to heat the hot zone, and where the component is outside the hot zone during the crystal growing process, the method comprising:

providing the furnace including the component;

removing the component from outside the hot zone;

placing the component within the hot zone; and heating the hot zone by the heating element to clean the component;

where the component is quartz.

20. The method of claim 1, where the component is graphite.

21. The method of claim 1, further comprising:

after heating the hot zone, cooling the furnace to substantially near room temperature;

opening the furnace; and vacuuming dust particles residual from the heating of the deposits.

22. A method of cleaning deposits from a component of a semiconductor crystal growing furnace, where the furnace is used in a crystal growing process, where the furnace includes a hot zone and a heating element configured to heat the hot zone, and where the component is outside the hot zone during the crystal growing process, the method comprising:

providing the furnace including the component;

removing the component from outside the hot zone;

placing the component within the hot zone; and heating the hot zone by the heating element to clean the component;

where heating the hot zone is accomplished by providing power to the heating element of the furnace for at least 2 hours.

23. The method of claim 1, further comprising:

before heating the hot zone, reducing the atmospheric pressure within the furnace; and flowing an inert gas through the furnace during heating.

24. A method of cleaning deposits from a component of a semiconductor crystal growing furnace, where the furnace is used in a crystal growing process, where the furnace includes a hot zone and a heating element configured to heat the hot zone, and where the component is outside the hot zone during the crystal growing process, the method comprising:

providing the furnace including the component;

removing the component from outside the hot zone;

placing the component within the hot zone; and heating the hot zone by the heating element to clean the component;

where heating the hot zone is accomplished by providing 75 to 150 kilowatts of power to the heating element for at least 2 hours.

25. The method of claim 1, further comprising:

before heating the hot zone, establishing a vacuum in the furnace, where the pressure in the vacuum is in a range from 5 millibar to atmospheric pressure.

26. The method of claim 1, further comprising:

before heating the hot zone, flowing an inert gas through the furnace at a rate of 10 to 500 liters per minute.

27. A method of cleaning deposits from a component of a semiconductor crystal growing furnace, where the semiconductor crystal growing furnace is used in a crystal growing process, where the semiconductor crystal growing furnace includes a hot zone and a heating element configured to heat the hot zone, and where at least a portion of the component is outside the hot zone of the semiconductor crystal growing furnace during the crystal growing process, the method comprising:

providing the component;

repositioning at least the portion of the component that is outside the hot zone during the crystal growing process from outside the hot zone of the semiconductor crystal growing furnace to a location within the hot zone of the semiconductor crystal growing furnace; and heating the hot zone to clean the component;

where the component is a purge tube, and where an upper portion of the purge tube is positioned outside the hot zone during the crystal growing process, and a lower portion of the purge tube is positioned inside the hot zone during the crystal growing process, and the repositioning includes positioning the upper portion of the purge tube inward of the heating element.

28. A method of cleaning deposits from a component of a first semiconductor crystal growing furnace by using a second semiconductor crystal growing furnace, where each of the first and second semiconductor crystal growing furnaces is used in a crystal growing process, where each of the first and second semiconductor crystal growing furnaces includes a hot zone and a heating element configured to heat the hot zone, and where at least a portion of the component is outside the hot zone of the first semiconductor crystal growing furnace during the crystal growing process, the method comprising:

provniding the component;

repositioning at least the portion of the component that is outside the hot zone during the crystal growing process from outside the hot zone of the first semiconductor crystal growing furnace to a location within the hot zone of the second semiconductor crystal growing furnace; and heating the hot zone of the second semiconductor crystal growing furnace to clean the component, without flowing a reactive gas through the furnaces.

* * * * *